(12) United States Patent　(10) Patent No.: US 6,732,534 B2
Spry　(45) Date of Patent: May 11, 2004

(54) VEHICLE TEMPERATURE-CONDITIONED CONTAINER WITH A POWER CONTROL CIRCUIT AND A DEFROST CIRCUIT

(75) Inventor: Michael B. Spry, Interlochen, MI (US)

(73) Assignee: Tellurex Corporation, Traverse City, MI (US)

( * ) Notice: Subject to any disclaimer, the term of this patent is extended or adjusted under 35 U.S.C. 154(b) by 315 days.

(21) Appl. No.: 09/921,493

(22) Filed: Aug. 3, 2001

(65) Prior Publication Data

US 2003/0126866 A1 Jul. 10, 2003

Related U.S. Application Data

(60) Provisional application No. 60/222,753, filed on Aug. 3, 2000.

(51) Int. Cl.⁷ .............................. F25B 21/02; B60H 1/32
(52) U.S. Cl. ................................ 62/3.7; 62/3.3; 62/3.6; 62/3.61; 62/244
(58) Field of Search ................... 62/3.6, 3.61, 3.7, 62/3.3, 244

(56) References Cited

U.S. PATENT DOCUMENTS

| 4,384,512 | A | | 5/1983 | Keith |
|---|---|---|---|---|
| 4,456,055 | A | * | 6/1984 | Yoshimi et al. ............. 165/202 |
| 4,823,554 | A | * | 4/1989 | Trachtenberg et al. ........ 62/3.3 |
| 5,027,611 | A | * | 7/1991 | Doi et al. .................. 62/158 |
| 5,099,649 | A | | 3/1992 | Zorn |
| 5,690,849 | A | * | 11/1997 | DeVilbiss et al. .......... 219/497 |
| 5,701,754 | A | | 12/1997 | Choi et al. |
| 5,867,990 | A | * | 2/1999 | Ghoshal ..................... 62/3.7 |
| 5,927,091 | A | | 7/1999 | Hong |
| 5,941,077 | A | | 8/1999 | Safyan |
| 6,026,646 | A | | 2/2000 | Hansen et al. |
| 6,092,381 | A | | 7/2000 | Hsiao et al. |
| 6,282,906 | B1 | * | 9/2001 | Cauchy ...................... 62/3.3 |
| 6,332,322 | B1 | * | 12/2001 | Tanaka ....................... 62/3.7 |
| 6,430,935 | B1 | * | 8/2002 | Klett et al. ................ 62/3.3 |

OTHER PUBLICATIONS

Gillen, Compact Thermoelectric Cooling System, Apr. 4, 2002, US PGP.*

VanHoudt, Switch–Mode Bi–Directional Thermoelectric Control Of Laser Diode Temperature, Sep. 5, 2002, US PGP.*

* cited by examiner

Primary Examiner—William C. Doerrler
Assistant Examiner—Filip Zec
(74) Attorney, Agent, or Firm—Flynn, Thiel, Boutell & Tanis, P.C.

(57) ABSTRACT

A temperature conditioned insulated container in a vehicle selectively heats or cools items stored therein. A thermoelectric energy module is coupled to a heat exchanger plate disposed in a compartment of the container. A power control circuit controls power to the thermoelectric energy module and a cooling fan motor. The drive circuit drives the thermoelectric energy module with a decaying drive signal for a predetermined time after the vehicle is shut down to prevent damage to the thermoelectric energy module. In a defrost operation, the drive circuit provides a decaying drive signal to the thermoelectric module during the beginning of a defrost cycle. After providing no cooling for a predetermined time, the drive signal is increased until the refrigerator operating system returns to full operation. By slowly varying the drive power in these situations, thermal stresses within the thermoelectric energy module are reduced.

20 Claims, 5 Drawing Sheets

VEHICLE TEMPERATURE-CONDITIONED CONTAINER WITH A POWER CONTROL CIRCUIT AND A DEFROST CIRCUIT

CROSS REFERENCE TO RELATED APPLICATION

This application claims the benefit of U.S. Provisional Application No. 60/222,753, filed Aug. 3, 2000.

FIELD OF THE INVENTION

The present invention relates generally to a temperature-conditioned container for a vehicle and, more particularly, to a temperature-conditioned container with a power control module that regulates the energizing of a temperature-conditioning assembly. The present invention also relates to a defrost arrangement for use with coolers/refrigerators generally used in trucks or other vehicles.

BACKGROUND OF THE INVENTION

There is an increasing interest in providing vehicles such as cars and trucks with containers in which items may be heated or cooled. It has been suggested that it is desirable to provide this type of container in a vehicle between the driver's seat and the adjacent front passenger's seat. An advantage of providing this type of container is that the persons in the vehicle will have ready access to food and beverage items that are maintained at a desirable temperature. Providing a driver with ready access to these items may lessen the extent to which the driver will divert his/her attention from the road and the state of the vehicle.

There are proposals to warm or cool the insides of these containers with heat pumps formed out of solid-state electrical components. In certain of these components, a thermal energy transfer effect, known as the Peltier effect, causes the assemblies with which they are integral, to function as heat pumps. One such heating/cooling assembly has been proposed in which a thermally conductive piece of metal is disposed inside the container to be warmed/cooled. This component is referred to as a heat exchanger. A section of the heat exchanger is coupled to a thermal energy pump or exchanger that is formed from a set of these solid-state components. A set of cooling fins, located outside of the container, are also coupled to the thermal energy exchanger. When the container is to be cooled, current is applied to the electrical components (forming the thermal energy exchanger) so that the exchanger functions as a heat sink to remove thermal energy from the container. The thermal energy removed from the container is transferred to the cooling fins. A fan, also part of the temperature-conditioning assembly, blows air across the cooling fins to foster the convective transfer of heat away from the fins. A more complete disclosure of containers of this design may be found in commonly owned U.S. Pat. No. 6,282,906 issued Sep. 4, 2001, entitled MOBILE VEHICLE TEMPERATURE CONTROLLED COMPARTMENT, which is incorporated herein by reference.

It is anticipated that the above-described assembly will be energized by the DC power supply system integral with the vehicle in which the assembly is installed. When the vehicle is running, its alternator will supply the power used to energize the thermal energy exchanger and the fan. The power drawn by these components does not affect the alternator's ability to provide power to the other electrical components of the vehicle or to charge the battery.

When the motor is turned off, there may still be instances in which it is desirable to continue to energize the components of the temperature-conditioned container. For example, on a summer day, an individual may store medicine or food product in the container that should be kept cool. Once the motor is off, the power to energize the thermal energy exchanger and the fan must come from the vehicle's battery. A disadvantage of this arrangement is that these components may excessively drain the charge stored in the battery. If this event occurs, the possibility arises that, when the persons return to the vehicle, the battery may not have enough power to actuate the vehicle's starter motor.

More importantly, sudden shutoff of power to the thermoelectric energy exchanger causes abrupt thermal changes or thermal shock that can shorten the working life and efficiency of thermoelectric exchangers or modules. Stress or damage can be caused by different rates of expansion and contraction with respect to temperature in the component materials of the thermoelectric modules.

One object of the invention is to provide a circuit for dampening thermal shock to a thermoelectric energy exchanger for heating or cooling an insulated compartment in a vehicle. Such a circuit dampens thermal shock to the thermoelectric modules and provides gradual thermal transitions to extend the life of the thermoelectric modules.

Another object of the invention is to dampen thermal shock to the thermoelectric energy modules during defrost cycles for a refrigerator or cooler in a vehicle, such as a truck.

SUMMARY OF THE INVENTION

This invention is related to a temperature-conditioned container assembly for an insulated container in a vehicle. The assembly includes an insulated container that defines a compartment for storing objects to be kept warm or cold. A heat exchanger plate has a first end disposed in the insulated compartment and a second end that extends away from the compartment. A thermoelectric energy module has first and second faces, the first facing being thermally coupled to the second end of said heat exchanger plate.

A drive circuit connected to a vehicle power source receives power to operate the thermoelectric energy module and to operate a fan motor. The drive circuit drives the thermoelectric energy module with a decaying output signal for a predetermined time to prevent damage to said thermoelectric energy module after the vehicle is shut down.

The assembly of this invention is also constructed so that a separate circuit supplies power to the fan. The circuit is designed to ensure that, regardless of the thermal energy exchanger or thermoelectric module being operated in the heating mode or in the cooling mode, and regardless of whether the thermal heat exchanger is operated at full or attenuated power, the proper current is applied to the fan at full power.

The assembly of this invention is further arranged so that the driver of the vehicle only has to pay nominal attention to the on/off state of the assembly when he/she enters and exits the vehicle.

One embodiment of the invention includes a defrost/operating system that provides a pulse width modulated drive signal to the thermoelectric device in a defrost cycle. The pulse width modulated drive signal decays during the beginning of the defrost cycle. After decaying to zero current, the thermoelectric device is not operated for a predetermined time. Finally the defrost/operating system provides an increasing pulse width modulated drive signal to slowly return the thermoelectric device to full operation. In this manner, sudden changes in the operation of the thermoelectric device are avoided.

This embodiment also includes a power protection circuit to prevent damage to any components of the defrost/operating system due to over voltages, transient voltages or the like.

BRIEF DESCRIPTION OF THE DRAWINGS

The invention is pointed out with particularity in the claims. The above and further advantages of the invention may be better understood by reference to the following detailed description taken in conjunction with the accompanying drawings in which:

DETAILED DESCRIPTION

Figure 1:
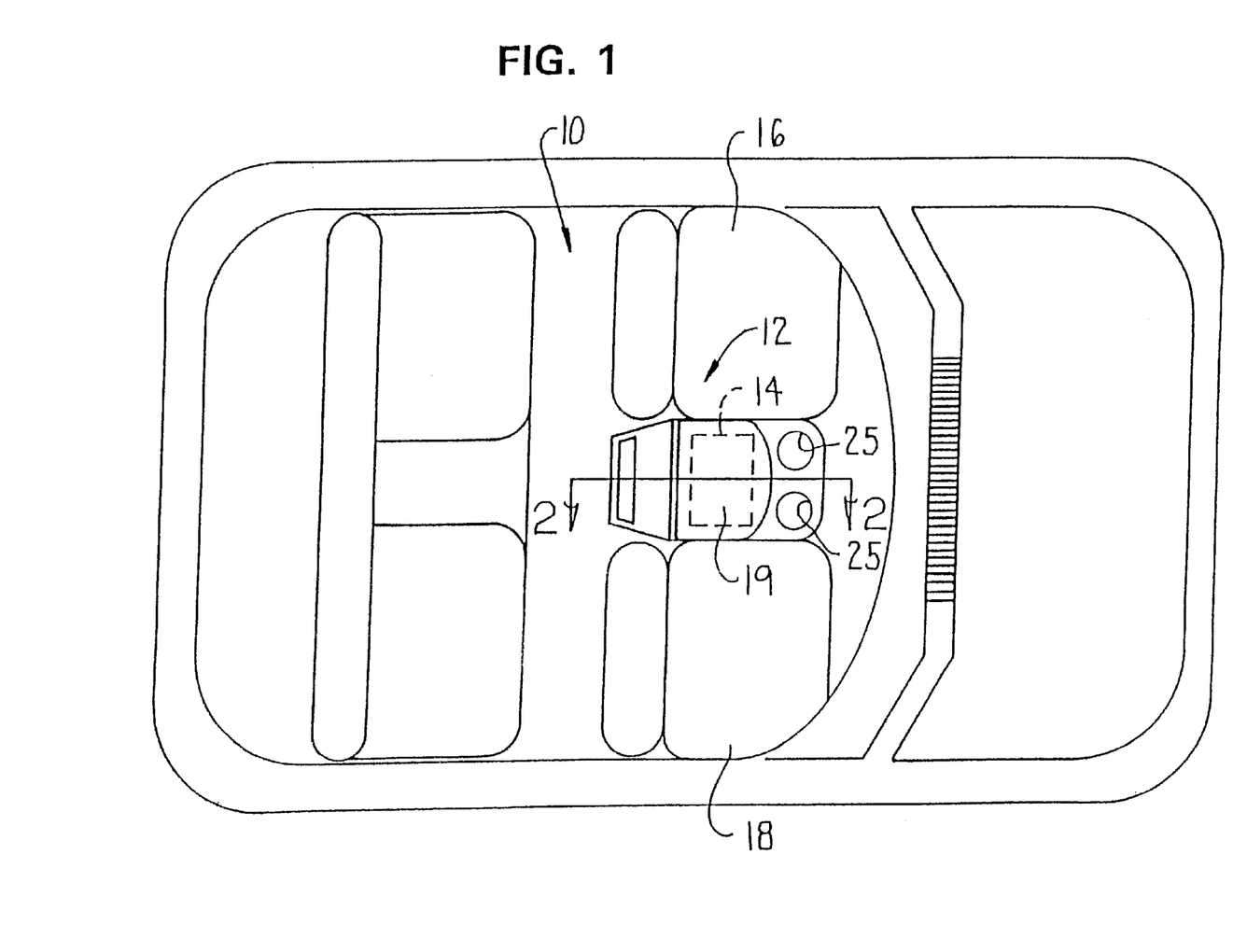
FIG. 1 depicts the basic temperature controlled compartment assembly of this invention and how the assembly may be mounted in a vehicle.
Figure 2:
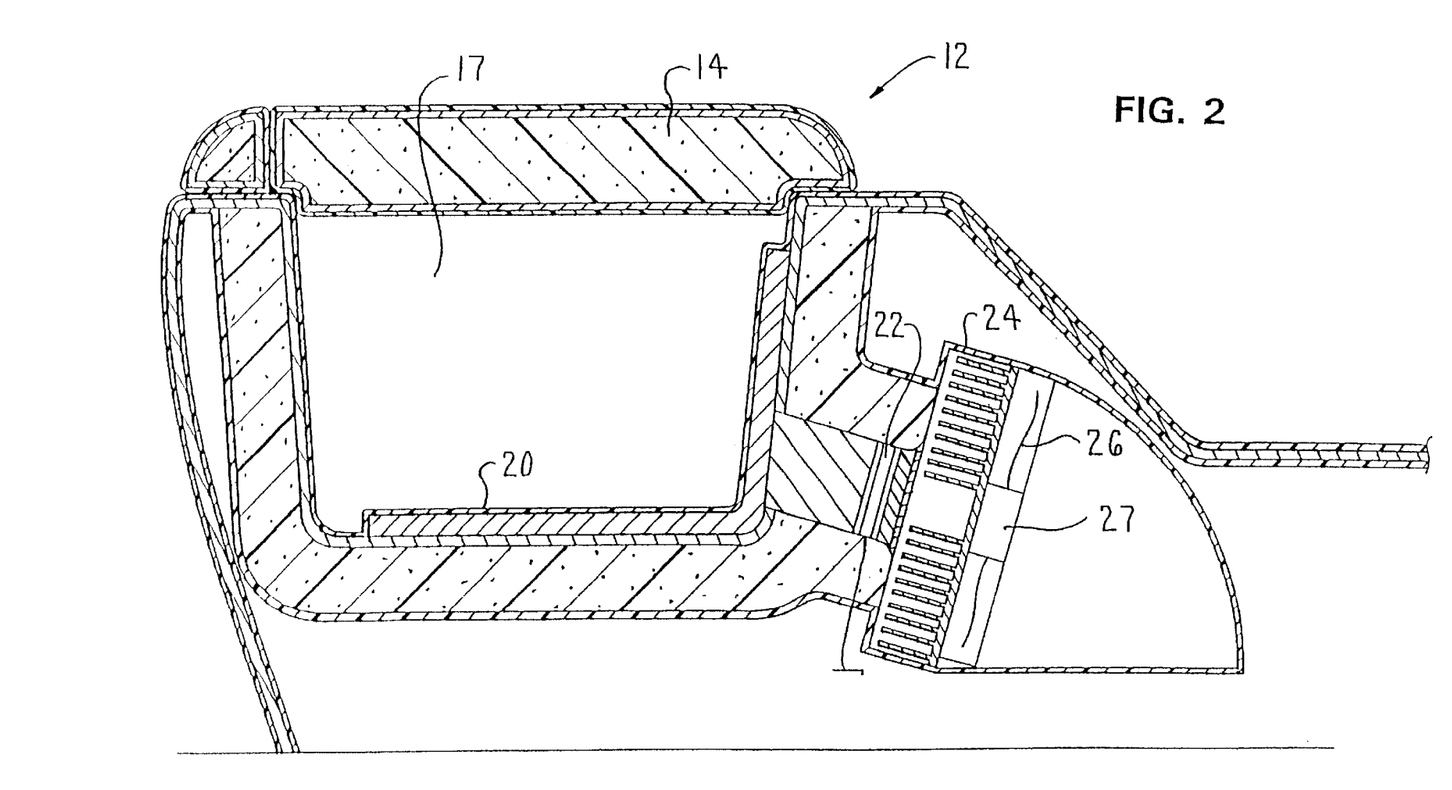
FIG. 2 is a cross section view of the control compartment of FIG. 1 taken along line 2—2 of FIG. 1.
Figure 3:
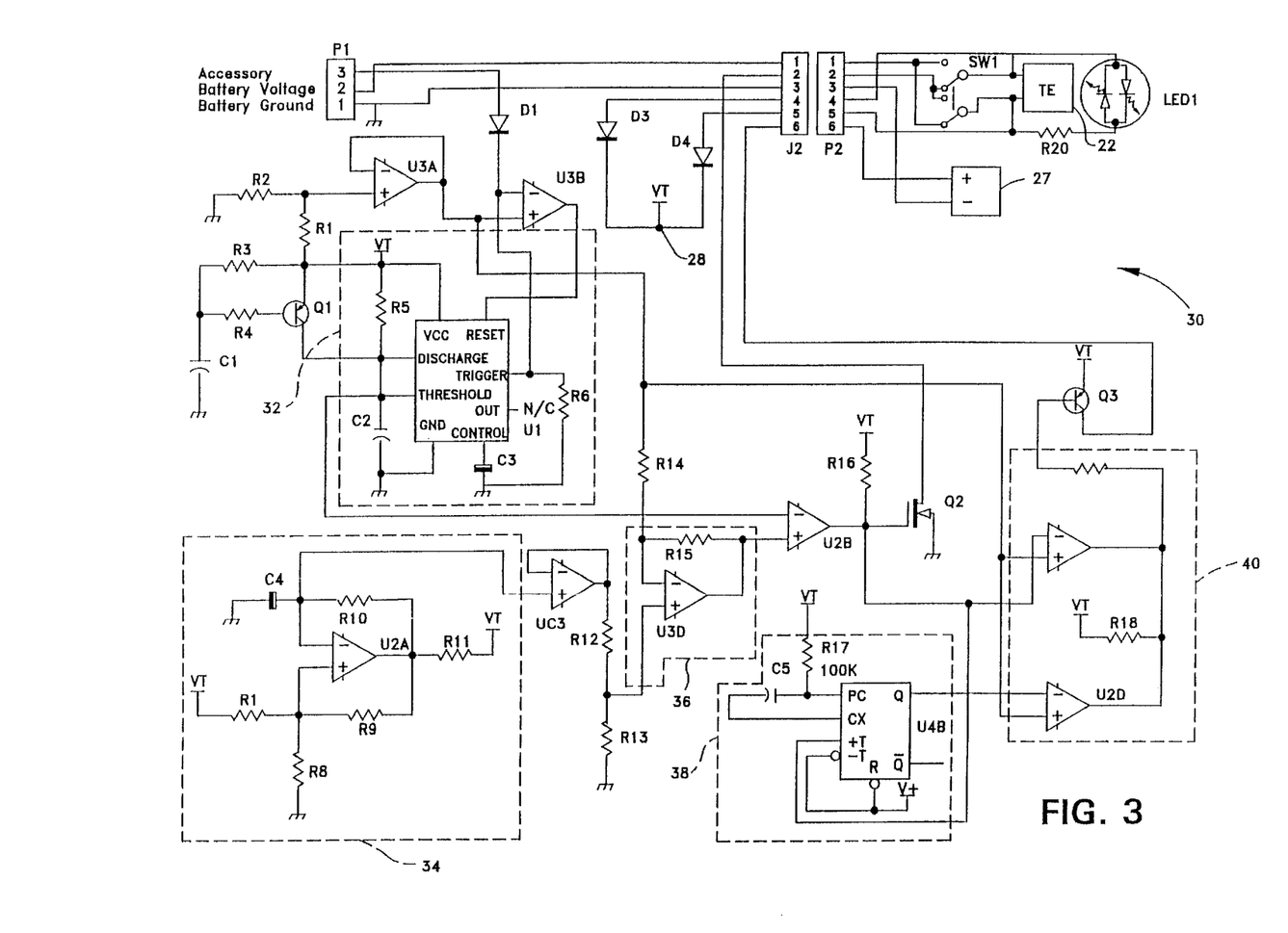
FIG. 3 is a schematic and block diagram of the electrical components of the assembly of this invention including a drive circuit.

FIG. 1 depicts the passenger compartment of a vehicle 10 in which the temperature-conditioned compartment assembly 12 of this invention is installed. Assembly 12 of this invention includes an insulated container 14 that is located between the driver and front passenger seats 16 and 18, respectively, of the vehicle 10. Container 14 defines an enclosed compartment 19 in which items may be cooled or warmed. The assembly 12 includes a heat exchanger plate 20 (FIG. 2) that is partially seated in the compartment 19. A portion of the heat exchanger plate 20 extends out of the insulated container 14 and abuts a thermal energy exchanger or thermoelectric energy module 22 as shown in FIG. 2. The thermoelectric energy module 22 comprises a set of solid-state semiconductor components that have a high Figure-Of-Merit. A set of cooling fins 24 are attached to the thermal energy exchanger 22 and are located forward of the insulated container 14. A fan 26 is positioned forward of the cooling fins 24 so as to blow air over the fins. In this embodiment, fan 26 is driven by a brushless DC motor 27 because it is optimized for continuous use (FIG. 3). However, other types of motors can be utilized.

The assembly 12 of this invention is operated by applying a current to the semiconductors internal to the thermal energy exchanger 22. If the current flows in a first direction, the semiconductor components pump heat from the heat exchanger plate 20. The air that is flowed over the fins 24 as a consequence of the operation of the fan 26, convectively transfers the heat away from the fins. When the assembly is operated in this state, since heat is being removed from the compartment 19, the assembly keeps items in the container 14 cool.

If the current flows in a second direction opposite to the first direction, the semiconductor component pumps heat from the cooling fins 24 to the heat exchanger plate. When the assembly is operated in this mode, the thermal energy exchanger 22 thus transfers thermal energy into the compartment 19 in order to keep stored items warm therein.

It should be understood that, in some versions of this invention, exposed recesses 25 are provided around a portion of the heat exchanger plate 20. Recesses 25 are sized to receive beverage containers. Thus, this portion of the assembly 12 is designed to allow the vehicle occupants to warm or heat beverages.

FIG. 3 is a schematic and block diagram of the electrically actuated components of the assembly 12 of this invention, including the thermal energy exchanger or thermoelectric module 22, and the fan motor 27. These components are part of a temperature-conditioning system 30 that is actuated from the power provided by the vehicle's electrical system.

FIG. 3 shows connector element P1 having three power input lines. Input 1 represents ground, input 2 represents the battery voltage and input 3 represents accessory voltage (when vehicle key places the ignition in the accessory position or the operating position).

Inputs 1 and 2 of connector element P1 connect to a jumper element J2 having six input/output lines that further connect inputs 1 and 2 to a connector element P2 having six input/output lines. Connector element P2 provides signals and power to components of the temperature conditioning system 30 from element J2. Input 1 of connector element P2 provides DC battery voltage to two opposing terminals of double throw switch SW1.

The switch SW1 can be moved between two positions for supplying the battery voltage to the thermoelectric energy module 22 by selecting either heating or cooling inside the container 14. The switch SW1 has a third shut-off position where no power is supplied to the thermoelectric module 22 or other portions of the drive circuit as will be explained later.

A bicolored light emitting diode LED1 is connected across the terminals of the thermoelectric energy module 22. Depending on the direction of current flow through the thermoelectric energy module 22, one of the two diodes internal to the light emitting diode LED1 will emit light. The emission of this light provides the vehicle occupants with an indication that the assembly is on and in which mode the assembly is operating. When the cooling mode is selected for the thermoelectric energy module 22, LED1 generates a green illumination. When the heating mode is selected, a red illumination is provided. When the control circuit uses decaying pulse width modulation (PWM), which will be described later, the intensity of the illumination will gradually fade until the circuit has stopped. Other arrangements including two separate light emitting diodes having different colors can also be utilized.

Diodes D3 and D4 are connected via inputs/outputs 4, 5 of jumper connector element J2 to inputs/outputs 4, 5 of connector element P2. Thus, the diodes are connected across the thermoelectric energy module 22 regardless of the position of switch SW1 as shown in FIG. 3. Whenever heating or cooling mode is selected, one of the diodes D3 or D4 will be forward biased so that only a positive voltage from across the thermoelectric energy module 22 can advance to voltage terminal 28 positioned between diodes D3, D4 and defining a voltage VT across the energy module.

The voltage VT at voltage terminal 28 is supplied to various parts of the temperature-conditioning system to power circuitry utilized to prevent thermal shock of the thermoelectric energy module 22.

When the switch SW1 is in the off position, however, the switch contacts do not touch any terminals therefore, the anodes of D3 and D4 are not connected to a voltage source, and thus the voltage VT is zero.

The drive circuitry for the thermoelectric energy module 22 includes a number of major circuits. More specifically there is a ramp generator circuit 32, a sawtooth generator circuit 34, a subtraction circuit 36, a pulse detector circuit 38 and a fan power circuit 40. The drive circuit enables the fan 26 to operate under full power as the voltage across the thermoelectric energy module 22 decays.

The ramp generator circuit 32 includes an LM555 integrated circuit U1 along with timing RC circuit R5, C2 and bypass capacitor C3. In this arrangement, U1 is wired like a monostable multivibrator, although it operates in a different manner.

If U1 were wired as a simple monostable multivibrator, at start up, there would be a lengthy ramp-up which could generate undesirable circuit operation. Thus, resistors R3, R4, capacitor C1 and transistor Q1 have been provided as shown in FIG. 3.

Resistor R4 is in series with the base-emitter junction of PNP transistor Q1. When VT is applied at the terminal shown above resistor R5 in FIG. 3, most of the initial current travels through the PNP transistor Q1 and thus bypasses timing resistor R4 to charge capacitor C2. This circuit enables capacitor C2 to charge rapidly to within a diode drop of voltage VT. The voltage across capacitor C2 then prevents transistor Q1 from operating, except for leakage current.

In some instances, the ramp generator circuit 32 outputs a low voltage signal. In other instances, the ramp generator circuit 32 outputs an increasing voltage ramping signal that eventually overcomes an output signal from the sawtooth generator circuit 34. The operation of the ramp generator circuit 32 will be discussed in detail later.

Figure 4:
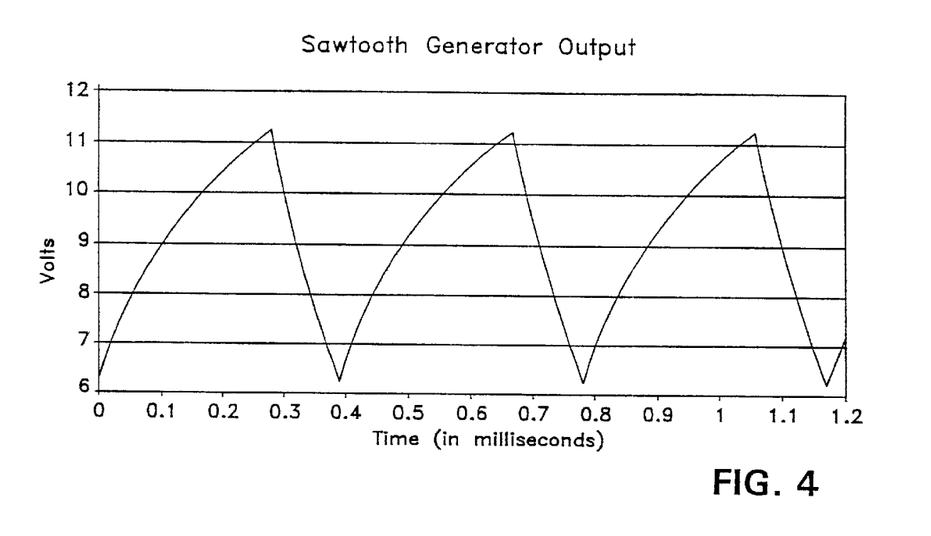
FIG. 4 is a diagram of a sawtooth generator output signal.

High-frequency sawtooth generator circuit 34 comprises comparator U2A, resistors R7–R11 and capacitor C4. Resistors R7–R9 and pull-up resistor R11 set the voltage points for switching the sawtooth output signal. Values of circuit elements are selected so that more time constants are required for the rising edge than the trailing edge of the sawtooth output signal. Voltage trigger points and the frequency of the sawtooth output signal can be determined by known equations. FIG. 4 shows output voltage of the sawtooth output signal versus time for one embodiment of the sawtooth generator circuit 34.

The disclosed sawtooth generator circuit 34 in this embodiment preferably outputs a sawtooth output signal that ramps between a voltage of 0.493VT and 0.895VT. The functions of this control circuit are dependent on voltage ratios rather than specific voltages, which makes circuit operation less dependent upon the actual battery voltage of the vehicle. That is why voltage VT, taken across the thermoelectric energy module 22, is applied to the drive circuit.

While the disclosed circuit shown in FIG. 3 is preferred, other known circuits can be utilized to provide a desired sawtooth output signal.

An operational amplifier U3C receives the output signal of the sawtooth generator circuit 34. The operational amplifier U3C acts as a voltage follower to buffer the sawtooth output signal.

Figure 5:
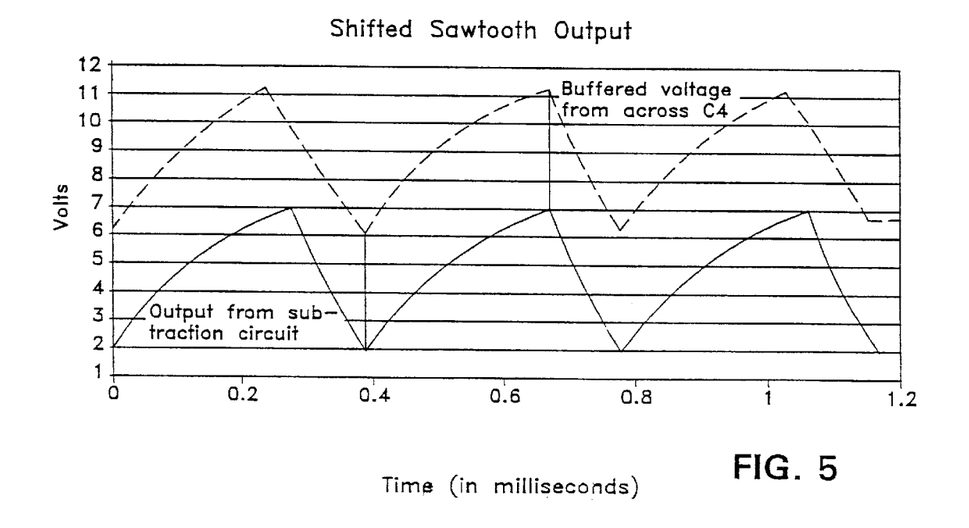
FIG. 5 is a diagram of a shifted sawtooth output signal.

A subtraction circuit 36 is provided to receive the sawtooth output signal from the sawtooth generator circuit 34. The subtraction circuit 36 includes an operational amplifier U3D and resistors R12–R15. The other input to the subtraction circuit is generated by voltage follower U3A. Voltage follower U3A buffers a substantially constant reference voltage generated across resistor R2. The net effect of the subtraction circuit is to provide a DC voltage shift across the entire voltage generated by the sawtooth output signal, as shown in FIG. 5. Thus the voltage is reduced by a fixed amount over the entirety of the sawtooth output signal. The waveform pattern of the sawtooth output signal is not changed significantly by the reduction in voltage.

The ramp signal output from the ramp generator circuit 32 is compared with the shifted sawtooth output signal at comparator U2B to generate an output from 0 to 100% duty cycle (PWM). The comparator produces an output signal to control the operation of drive transistor $Q_2$. This signal, when high, drives $Q_2$ into saturation to provide electrical current for the thermoelectric energy module 22. When this signal goes low (0 volts), drive transistor $Q_2$ is cut off to deprive the thermoelectric energy module 22 of energizing current. In other instances, the signal from comparator $U_{2B}$ will be a decaying pulse-width-modulated signal to provide a slow on-to-off transition for the thermoelectric energy module 22; this gradual transition helps to protect the element 22.

Pulse detector circuit 38 includes a retriggerable monostable multi-vibrator integrated circuit U4B, resistor R17 and capacitor C5. Pulse detector circuit 38 receives, in some instances PWM output signals from comparator U2B and outputs a high logic level in response thereto.

Fan power circuit 40 includes a pair of comparators U2C, U2D and resistors R18, R19 connected to form a NOR-gate configuration. The purpose of the fan power circuit is to output a constant voltage to the fan whenever any current is provided to the thermoelectric energy element 22. This voltage is applied to the fan through PNP transistor $Q_3$. The NOR gate configuration supplies saturation bias current to transistor $Q_3$ so long as a high logic level or pulse train (PWM) is output from comparator $U_{2B}$.

The operation of the temperature conditioning system 30 can be explained by examples of various operating modes as follows.

In a first mode the vehicle is operating and the mode switch SW1 is set to cooling or heating the inside of the insulated container 14. When the vehicle is operating the accessory voltage provides a high voltage signal through diode D1 to a trigger input of integrated circuit U1 and a signal to inverter U3B. With the accessory voltage high, U3B provides a low output signal to the reset input of integrated circuit U1. This input signal resets U1 and discharges C2. With no appreciable voltage across C2, the shifted-sawtooth output from U3D is higher than the voltage at the inverting input of comparator U2B. Thus the output voltage signal of U2B will always be high. Therefore, transistor Q2 will be in constant saturation, thus providing a constant voltage across the thermoelectric energy module 22. This drive circuit operation, of course, requires positioning of manual switch SW1 in a selected position to provide voltage VT throughout the drive circuit.

Another mode is created when the accessory voltage is switched off (open circuit). In this mode, thermal dampening begins. The low accessory voltage is provided at the trigger of integrated circuit U1. Likewise, the low accessory voltage is inverted at inverter U3B to provide a high voltage to the reset input of U1. With the reset input high and the trigger input low, capacitor C2 begins charging. The voltage output by comparator U2B remains high to hold the driving transistor Q2 in saturation. Once capacitor C2 charges beyond the lowest shifted saw-tooth voltage, comparator U2B will begin to produce a pulse-width modulated output signal. At first the duty cycle of the pulse train will be relatively high, but as capacitor C2 continues to charge, providing an increasing ramping voltage, the duty cycle of the pulse-width modulated output signal will decrease. Eventually the voltage at capacitor C2 will charge beyond the highest voltage of the shifted sawtooth output signal. Then the comparator U2B provides a continuously low output signal and the thermoelectric energy module 22 stops operating entirely. At this point the control circuitry will continue operating, even though the thermoelectric energy module 22 is shut off.

As set forth earlier, the fan power circuit 40 outputs a constant DC voltage to the fan motor 27 until the NOR-gate configuration fails to sense a pulse from the pulse detector circuit 38, the output of U2B goes low, or the mode switch SW1 is set to its center off position, and then the fan motor 27 is shut down entirely.

In conclusion, the temperature conditioning system 30 provides a decaying pulse width modulated signal to drive the thermoelectric energy module 22 when the vehicle is shut off and the manual switch SW1 remains in either operating position.

It should be understood that the foregoing is directed to one specific version of the invention and that other versions of the invention may vary from what has been described. For example, other logic elements, capacitors, and resistors may be arranged to perform the same functions as the specifically disclosed ramp generator circuit 32, sawtooth generator circuit 34, subtraction circuit 36, pulse generator circuit 38 and fan power circuit 40.

Alternatively, two or more components of the drive circuit may be integrated into a single circuit arrangement. For example, the sawtooth generator circuit 34 could also be modified to include the function of the subtraction circuit 36 or modified to not require the voltage shift provided by the subtraction circuit.

A version might be designed which uses a ramping voltage level to power the thermoelectric module rather than decaying PWM. Such version can utilize analog circuitry rather than digital circuitry.

Furthermore, in some versions of the invention, the temperature conditioning system may only include a thermoelectric energy module 22. It may not be necessary to provide a fan. In these versions of the invention, the fan power circuit 40 would not be necessary.

Figure 6:
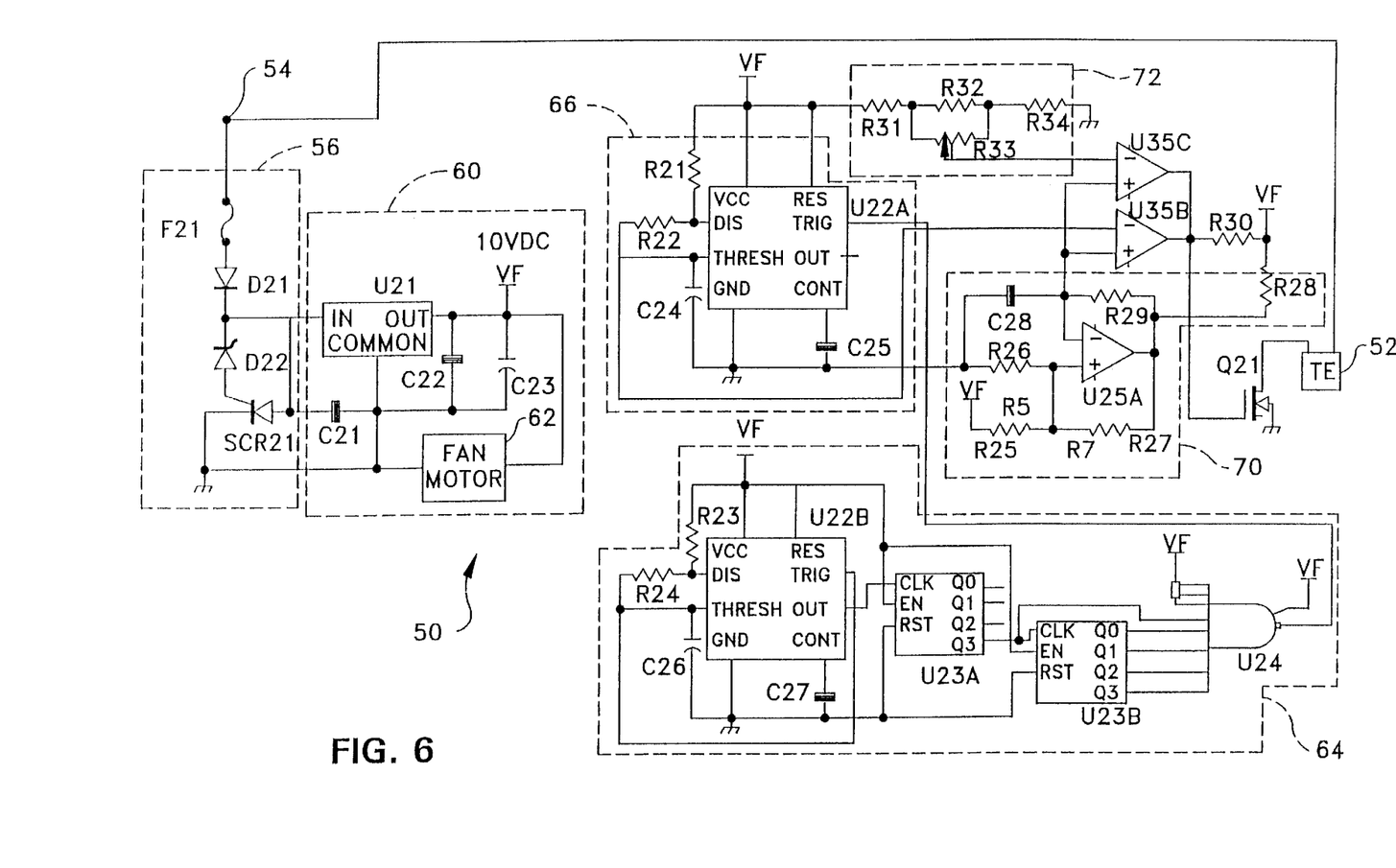
FIG. 6 is a schematic and block diagram of the electrical components for a defrost/operating system of another embodiment of the invention utilizing pulse width modulation to defrost a refrigerator.

The schematic and block diagram of FIG. 6 illustrates another embodiment of the invention utilizing pulse width modulation drive signals to protect a thermoelectric device during defrosting of a thermoelectric refrigerator that preferably is used in a truck or other large vehicle. The vehicle can be a truck cab for pulling a trailer and having a relatively large refrigerator, such as a refrigerator with a volume capacity of 40 quarts.

The embodiment shown in FIG. 6 also provides power protection for a defrost/operating system 50.

The defrost/operating system 50 in FIG. 6 can provide a constant voltage to the thermoelectric device 52 to promote cooling of an insulated container or a refrigerator. In a defrost cycle, however, the defrost/operating system 50 provides a pulse width modulated drive signal to the thermoelectric device 52. The pulse width modulated drive signal decays to continuously reduce the cooling of the thermoelectric device 52. Then the thermoelectric device 52 is not operated for a predetermined time. Finally the defrost/operating system 50 provides an increasing pulse width modulated drive signal to slowly return the thermoelectric device 52 to full operation. In this manner, sudden changes in the operation of the thermoelectric device 52 are avoided.

By applying a decaying pulse width modulated drive signal to the thermoelectric device 52, the thermal stresses caused by the different rates of expansion and contraction among the constituent materials within the thermoelectric device are reduced. Thus, the life of the thermoelectric device can be extended and possible damage to the device can be lessened.

The defrost/operating system 50 includes a battery voltage terminal 54 for receiving a battery voltage from a vehicle. The battery voltage is input to the thermoelectric device 52 and to a voltage protection circuit 56.

The voltage protection circuit 56 includes a fuse F21, a zener diode D22 and a silicon controlled rectifier SCR21. If the battery voltage rises above an expected voltage, the diodes D21, D22 and silicon controlled rectifier SCR21 begin to conduct. Silicon controlled rectifier SCR21 effectively latches in a near short circuit condition and fuse F21 breaks, removing all power to the defrost/operating system 50. This operation protects circuit elements and prevents fire, smoke or excessive heat.

The voltage protection circuit 56 provides power to a fan drive circuit 60. The fan drive circuit 60 includes a three pin voltage regulator U21, capacitors C21–C23 and fan drive motor 62 as shown in FIG. 6. The fan drive circuit 60 provides a constant DC voltage to continuously power a cooling fan.

No on/off switch for the refrigerator is shown in FIG. 6. Such an on/off switch is a standard element and thus is not described herein. An on/off switch would preferably be positioned between the battery and diode D21.

The fan drive circuit 60 also outputs a constant voltage VF. The voltage VF is used for powering various circuit elements of the drive circuitry. The voltage VF preferably is a constant 10 volts DC. However, the circuitry operates according to proportional voltages. Therefore, variations in voltage VF do not have a major impact on the operation of the defrost/operating system 50.

The drive circuitry includes a timing circuit 64 for controlling the refrigeration/defrost cycle. The timing circuit 64 includes a first timer U22B that is wired as an astable multivibrator, timing resistors R23 and R24, timing capacitor C26, bypass capacitor C27, dual binary counters U23A, U23B and NAND-gate U24. The dual binary counters U23A, U23B are cascaded to count the timer U22B pulses to provide a periodic output signal. The cascaded binary counters U23A, U23B, in combination with the wiring to NAND gate U24, develops a pulse cycle which is 256 times longer than an individual cycle produced by timer $U_{22B}$.

In operation, the binary counter U23B only advances its counting number or position, when a high signal is sent by Q3 from the counter U23A. All of the outputs Q0–Q3 of binary counter U23B and output Q3 from counter U23A are connected to inputs of NAND-gate U24. The NAND gate U24 has three inputs tied to high voltage VF, and five inputs connected to the above mentioned outputs.

The NAND gate U24 operates to provide a low output signal when all input signals are at a high voltage. Eight pulses of the 256 pulses output will be low, thus defining the defrost interval. The defrost interval preferably lasts from 25 to 35 minutes. The timing cycle between defrost intervals can be about 32 times greater than the defrost interval utilizing the binary counter arrangement. Thus the timing cycle between defrost intervals can be about 16 hours.

The timing cycle between defrost intervals and the actual amount of time for the defrost interval can be varied by varying the elements of the timing circuit 64 or the connections between the various elements. The disclosed timing circuit 64 is merely a preferred arrangement.

The output signal from the NAND gate U24 is input to a trigger input of a timer U22A of ramp circuit 66. The ramp circuit 66 also includes resistors R21, R22 and capacitors C24, C25. The timer U22A is wired like an astable multivibrator, except the trigger input is not connected to the threshold input/output. If a low voltage signal is provided at the trigger input, capacitor C24 starts to charge through resistors R21, R22 until a constant voltage less than VF is obtained. The constant voltage will be maintained until timer U22A receives a high voltage signal at the trigger input and then the voltage of the capacitor C24 discharges. The ramping effect of the capacitor voltage in driving the thermoelectric device 52 will be discussed later.

A sawtooth generator circuit 70 includes a comparator U25A, resistors R25–R29 and capacitor C28. The sawtooth generator circuit 70 can generate a sawtooth output signal similar to that shown in FIG. 4 of the first embodiment. In this embodiment the sawtooth waveform preferably fluctuates between about 5 volts and 8.7 volts. The output voltage of the sawtooth output signal is, of course, dependent on voltage VF, which supplies power to the circuit. The frequency of the sawtooth output signal is controlled by circuit component values in a manner similar to that set forth in the sawtooth generator circuit of the first embodiment of the invention.

A voltage divider circuit 72 includes resistors R31, R32, R34 and adjustable potentiometer R33. The purpose of the voltage divider is to control a pulse width modulated drive signal when the refrigerator is not in a defrost mode. This allows the user to adjust the amount of cooling power.

Drive elements for the defrost/operating system 50 include a pair of comparators U35B and U35C. The sawtooth output signal is coupled to the non-inverting input of both of the comparators U35B, U35C. The inverting input of U35C is connected to an output of the voltage divider 72. The inverting input of U35B is connected to an output from the ramp circuit 66. The output is taken across capacitor C24.

The outputs of comparators $U_{35B}$ and $U_{35C}$ are effectively connected in an AND configuration. Since the timing for both comparators $U_{35B}$ and $U_{35C}$ is dependent upon the sawtooth output signal coupled to their non-inverting inputs, the comparators are completely synchronized. With their outputs wired in an AND configuration, whichever comparator output has the lowest duty cycle, will control drive transistor $Q_{21}$ for the thermoelectric device 52.

During normal operating intervals of the refrigerator, the voltage across capacitor $C_{24}$ of the ramp circuit 66 is low and the output of $U_{35B}$ goes into an open collector state (where the logic level becomes solely dependent on the states of other components connected to the same point). In this case, $U_{35C}$ controls the action of transistor $Q_{21}$. If the voltage from voltage divider 72 is always lower than the sawtooth output signal, the outputs of $U_{35C}$ and $U_{35B}$ will stay high continuously, driving $Q_{21}$ into saturation and providing full current to the thermoelectric device 52. If any portion of the sawtooth voltage is above the level from the voltage divider 72, the output of $U_{35C}$ will go low for the duration of that part of the sawtooth. The result is a pulse-width modulated signal with a fixed duty cycle for driving transistor $Q_{21}$. Typically, the values of $R_{31}$–$R_{34}$ would be chosen to prevent users from adjusting $R_{33}$ to a level which would produce a 0% duty cycle (although it would certainly be possible to do so in another iteration of this invention). Thus, the adjustment of $R_{33}$ allows a user to control the amount of cooling power under normal operation by pulse-width modulating the electrical current drive for the thermoelectric device 52 between 100% (full power) and some lower duty cycle. The user can thus adjust the normal performance of the refrigerator to reflect personal cooling preferences.

Operation of the defrost cycle follows. Once the defrost cycle begins, the ramp cycle interacts with the sawtooth signal (through the action of $U_{35B}$) to provide decaying pulse-width modulated signals. After a brief period with the refrigerator at no power, the ramp circuit 66 then operates to provide an increasing duty cycle until the defrost cycle ends.

When the timing circuit 64 provides a high voltage signal to the ramp circuit 66, the capacitor C24 begins to charge. The capacitor C24 provides a ramp circuit output to the inverting input of comparator U35B. As the ramp circuit output voltage increases beyond the lowest point of the sawtooth output signal, a pulse width modulated drive signal is output from the comparator U35B. As the ramp circuit output voltage increases, the pulse widths of the pulse width modulated drive signal become smaller or narrower. Thus, as in the first described embodiment, a decaying pulse width modulated drive signal is obtained.

Once the ramp circuit output voltage exceeds the maximum voltage of the sawtooth output signal, the output of comparator $U_{35B}$ remains low continuously to cut off transistor $Q_{21}$ and deprive the thermoelectric device 52 of any current.

After the timing circuit 64 counts as described earlier, and outputs a low voltage signal to the ramp circuit 66, the voltage output from the ramp circuit decreases as capacitor C24 discharges. Thus, narrow pulse width modulated signals begin to be output from comparator U35B as parts of the sawtooth output signal begin to be greater than the decreasing voltage output by the ramp circuit 66. The pulse widths increase until the defrost cycle ends and normal operation resumes.

In some embodiments, the entire defrost cycle can last about 32 minutes. Of the 32 minutes, the decaying phase and the increasing phase of the output drive signal can be about 10 minutes each. Thus, the thermoelectric device is completely off for about 12 minutes of the defrost cycle.

The major advantages of slow changes in power to the thermoelectric device 52 have been described in detail earlier.

It should be understood that the foregoing is directed to one specific version of the invention and that other versions of the invention may vary from what has been described. For example, other logic elements, capacitors, and resistors may be arranged to perform the same functions as the specifically disclosed voltage protection circuit 56, fan driving circuit 60, timing circuit 64, ramp circuit 66, sawtooth generator circuit 70 and voltage divider circuit 72.

Alternatively, two or more components of the drive circuit may be integrated into a single circuit arrangement. For example, the sawtooth generator circuit 70 could also be modified to include the function of the ramp circuit 66.

A circuit could also be designed which uses a ramping linear voltage, rather than pulse-width modulation, to slow the thermal transitions. The temperature-conditioned compartment or area itself may take other forms such as heat sinks with air circulation. Therefore, it is the object of the appended claims to cover all such variations and modifications that come within the true spirit and scope of the invention.

What is claimed is:

1. A temperature controlled container assembly for installation in a vehicle, said assembly comprising:

an insulated container that defines a compartment;

a heat exchanger plate having a first end disposed in the compartment of said insulated compartment and a second end that extends away from the compartment;

a thermoelectric energy module, said thermoelectric energy module having first and second faces, the first face being thermally coupled to the second end of said heat exchanger plate;

a cooling fin assembly secured to the second face of said thermoelectric energy module;

a cooling fan having a fan motor directed to force air over said cooling fin assembly; and a drive circuit connected to a vehicle power source for receiving power and to said thermoelectric energy module and said fan motor for actuating said thermoelectric energy module and said fan motor, said drive circuit adapted to drive said thermoelectric energy module with a decaying or ramping output signal for a predetermined time when power changes are necessary to prevent damage to said thermoelectric energy module.

2. A temperature controlled container assembly comprising:

an insulated container that defines a compartment;

a thermoelectric energy module for controlling the temperature of said compartment;

a cooling fan having a fan motor; and a temperature conditioning circuit comprising:

an operating switch for selecting a cooling or heating condition for the inside of the container;

a ramp generating circuit providing a ramp signal;

a sawtooth generating circuit and signal conditioning circuitry for providing a conditioned sawtooth signal;

a comparator for comparing the ramp signal and the conditioned sawtooth signal to generate a drive signal to drive said thermoelectric energy module;

a detector circuit for receiving the drive signal from the comparator; and a fan power circuit for applying constant power to said fan motor when said detector circuit detects the presence of the drive signal.

3. The temperature controlled container assembly of claim 2, wherein in a first mode of operation, the operating switch is selectively closed so that the drive signal drives said thermoelectric energy module at full power.

4. The temperature controlled container assembly of claim 3, wherein in a second mode of operation, when a vehicle providing a power source for the temperature conditioning circuit is shut down while the operating switch remains closed, the ramp signal ramps upwardly until the ramp signal is greater than portions of the conditioned sawtooth signal, the ramp signal continuing to increase so that the drive signal driving said thermoelectric energy module gradually decays, whereby thermal stresses caused by different rates of expansion and contraction among constituent materials of said thermoelectric energy module are reduced, thereby extending the life of said thermoelectric energy module.

5. The temperature controlled container assembly of claim 3, wherein said comparator comprises an amplifier.

6. The temperature controlled container assembly of claim 2, including light emitting diodes connected to said thermoelectric energy module, wherein, depending on a direction of current flow through said thermoelectric energy module, one of two colors is emitted providing an indication that said thermoelectric energy module is operating and in which condition said thermoelectric energy module is operating.

7. The temperature controlled container assembly of claim 6, wherein, when the cooling condition is selected, one of the light emitting diodes provides a green illumination, and when the heating condition is selected, the other of the light emitting diodes emits a red illumination.

8. A temperature controlled refrigerator assembly comprising:

an insulated container that defines a compartment;

a thermoelectric energy module for cooling said compartment; and a defrost/operating system comprising:

a ramp generating circuit for providing a ramp signal;

a generating circuit for providing an output signal;

a defrost timing circuit for providing an adjustable reference signal for a defrost cycle; and a comparator circuit for comparing the output signal and the ramp signal and comparing the output signal with the adjustable reference signal to generate a variable drive signal to power said thermoelectric energy module, wherein the defrost timing circuit 1) provides the adjustable reference signal to said comparator circuit so that said comparator circuit provides the drive signal as a decaying drive signal to said thermoelectric energy module for a first predetermined time period until complete decaying of the drive signal, 2) maintains the absence of said drive signal to said thermoelectric energy module for a second predetermined time period, and 3) restarts powering of said thermoelectric energy module by increasing the drive signal from said comparator circuit for a third predetermined time period, until the drive signal achieves a preselected value.

9. The temperature controlled refrigerator assembly of claim 8, wherein the comparator circuit comprises a first amplifier for comparing the output signal with the ramp signal and a second amplifier for comparing the output signal with the adjustable reference signal to drive said thermoelectric energy module.

10. The temperature controlled refrigerator assembly of claim 9, wherein said first and second amplifiers are connected in an AND configuration so that said first or second amplifier with the lowest output signal controls the drive signal driving said thermoelectric energy module.

11. The temperature controlled refrigerator assembly of claim 8, further comprising a voltage protection circuit for receiving DC voltage from a battery.

12. The temperature controlled refrigerator assembly of claim 11, further comprising a fan drive circuit for receiving power from said voltage protection circuit and applying power to a fan motor.

13. The temperature controlled refrigerator assembly of claim 12, wherein said fan drive circuit outputs a constant voltage as a power supply voltage for said ramp circuit, said timing circuit and said generating circuit.

14. The temperature controlled refrigerator assembly of claim 8, including a voltage divider circuit for enabling manual adjustment of the temperature of said container by selecting the preselected value for said drive signal.

15. The temperature controlled refrigerator assembly of claim 8, wherein said drive signal comprises a pulse width modulated drive signal.

16. The temperature controlled refrigerator assembly of claim 8, wherein said generating circuit comprises a sawtooth generating circuit and said output signal comprises a sawtooth signal.

17. The temperature controlled refrigerator assembly of claim 9, wherein said generating circuit comprises a sawtooth generating circuit and said output signal comprises a sawtooth signal.

18. The temperature controlled refrigerator assembly of claim 11, wherein said generating circuit comprises a sawtooth generating circuit and said output signal comprises a sawtooth signal.

19. The temperature controlled refrigerator assembly of claim 14, wherein said generating circuit comprises a sawtooth generating circuit and said output signal comprises a sawtooth signal.

20. The temperature controlled refrigerator assembly of claim 15, wherein said generating circuit comprises a sawtooth generating circuit and said output signal comprises a sawtooth signal.

* * * * *